United States Patent [19]

Fukuzawa et al.

[11] 4,366,567
[45] Dec. 28, 1982

[54] SEMICONDUCTOR LASER DEVICE

[75] Inventors: Tadashi Fukuzawa, Tokyo; Michiharu Nakamura; Susumu Takahashi, both of Hinodemachi, all of Japan

[73] Assignee: Hitachi, Ltd., Tokyo, Japan

[21] Appl. No.: 204,231

[22] Filed: Nov. 5, 1980

[30] Foreign Application Priority Data

Nov. 14, 1979 [JP] Japan .............................. 54/146578

[51] Int. Cl.$^3$ .............................................. H01S 3/19
[52] U.S. Cl. ...................................... 372/38; 357/41; 372/50
[58] Field of Search ...................... 331/94.5 H, 94.5 S; 372/38, 45, 46, 50, 26; 357/17, 41

[56] References Cited

PUBLICATIONS

Yust et al., "A Monolithically Integrated Optical Repeater", *Appl. Phys. Lett.*, vol. 35, No. 10, Nov. 15, 1979, pp. 795–797.
Ury et al., "Monolithic Integration of an Injection Laser and a Metal Semiconductor Field Effect Transistor", *Appl. Phys. Lett.*, vol. 34, No. 7, Apr. 1, 1979, pp. 430–431.
Hung et al., "Integrated Light–Emitting Devices with Silicon LSI Circuits", *IBM Technical Disclosure Bulletin*, vol. 22, No. 1, Jun. 1979, p. 401.

*Primary Examiner*—James W. Davie
*Attorney, Agent, or Firm*—Kenyon & Kenyon

[57] ABSTRACT

Disclosed is a semiconductor laser device comprising a layered semiconductor region capable of laser oscillation and including at least an optical confinement region consisting of stacked semiconductor layers, means for injecting current into the optical confinement region, and means for constructing an optical resonator; switching means for supplying the layered semiconductor region capable of laser oscillation with a current having a value near a threshold current value for the laser oscillation; and switching means for feeding a current to be superposed on the current supplied to the layered semiconductor region capable of laser oscillation, this switching means being capable of controlling the current to be superposed through an external input thereof.

11 Claims, 24 Drawing Figures

SEMICONDUCTOR LASER DEVICE

BACKGROUND OF THE INVENTION

1. Field of the Invention

This invention relates to a semiconductor light emitting device of a novel structure wherein the modulation of a semiconductor laser element is effected with transistors which are integrated and disposed on the same substrate as that of the semiconductor laser.

2. Description of the Prior Art

A semiconductor laser element provides a wide application in, for example, optical communication systems such as data bus or computer-link since it is small in size and capable of performing rapid modulation.

The modulation of a semiconductor laser element is usually performed in such a manner as described below. A direct current is sent through a circuit element called a bias-T unit, consisting of a capacitor and a coil, from the side of the coil; the excitation concentration is raised up to near the laser oscillation threshold; and the laser output light is modulated through the superposition of a current pulse of 30 to 70 mA sent from the side of the capacitor. Such apparatus have been put on the market. However, in the case where a high speed modulation of 1 to 2 Gbits/sec. is desired according to the above method, it is difficult for ordinary silicon transistors to generate such current pulses as suitable for the high speed modulation. Moreover, the bias-T unit is very voluminous in comparison with the laser element and the size of a laser apparatus incorporating therein many laser elements cannot be made compact.

SUMMARY OF THE INVENTION

A semiconductor light emitting device of this invention comprises a layered semiconductor region capable of laser oscillation, and at least two sets of switching elements, one of which provides means for supplying a current near a laser oscillation threshold value to the layered semiconductor region for the laser oscillation and the other of which provides means for modulating the laser beam on the basis of an external input thereof.

It is practical that the switching elements are formed of field-effect transistors (hereinbelow, abbreviated to "FETs"). The sources (or drains) of the two FETs are short-circuited, and the node is connected to one electrode of the layered semiconductor region causing the laser oscillation. Further, the drains (or sources) of the two FETs are short-circuited, and the node is used as a part for an external input.

According to this invention, a composite or combined semiconductor light emitting device which consists of a semiconductor laser and switching elements and which is compact can be provided. The composite semiconductor light emitting device can perform modulation up to a high frequency region directly. In addition, the yield or available percentage in manufacture can be sharply increased.

DETAILED DESCRIPTION OF THE PREFERRED EMBODIMENTS

Figure 1:
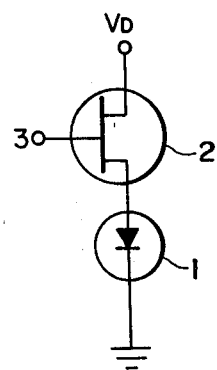
FIGS. 1 and 2 are diagrams each showing an equivalent circuit of a composite device in which a semiconductor laser and an FET are integrated.
Figure 2:
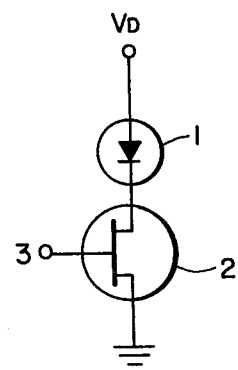

The inventor has proposed a semiconductor light emitting device in which, for example, a GaAs field-effect transistor (abbreviated to "GaAs FET") being excellent as a high-frequency transistor and a semiconductor laser element are integrated in combination and which is now pending (U.S. patent application Ser. No. 125,779). FIG. 1 shows an equivalent circuit of this semiconductor light emitting device. In the figure, numeral 1 designates a semiconductor laser element, numeral 2 an FET, and numeral 3 a gate electrode. Also FIG. 2 shows an equivalent circuit of a semiconductor light emitting device of the same sort. As in FIG. 1, numeral 1 indicates a semiconductor laser element, numeral 2 an FET, and numeral 3 a gate electrode.

However, problems to be described below have been found in these semiconductor light emitting devices which are the monolithically integrated devices.

A D.C. voltage $V_D$ is applied to the monolithically integrated device, and a modulating signal is put into the gate of the FET. Let $I_1$ denote a current which is flowing in the absence of the gate signal (during the zero bias), and $\Delta I$ denote a current which is suppressed by the pulse applied to the gate. In a desirable monolithically integrated device, the value of $(I_1-\Delta I)$ becomes approximately equal to or somewhat greater than the oscillation threshold current $I_{th}$ of the laser element. In this case, the modulation factor of the laser power is great, the period of time in which the laser element rises for the oscillation becomes the shortest, and no phase lag occurs.

Figure 3:
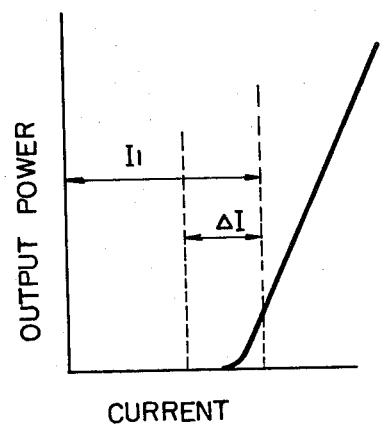
FIGS. 3 and 4 are graphs each elucidating the relations of the characteristic of output power and the current value of the FET versus the current of the laser diode.
Figure 4:
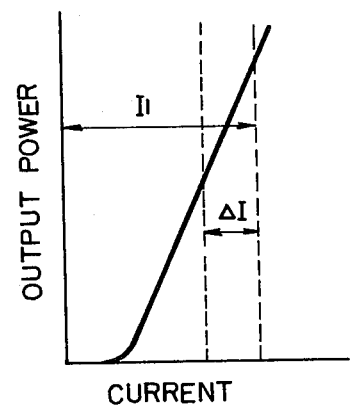

In actual devices, it is very common that the threshold values of laser elements deviate to the extent of $\pm 30\%$. Accordingly, a case where $(I_1-\Delta I)$ is smaller than $I_{th}$ and a case where the former is greater than the latter take place. The relationships in the respective cases between the characteristic of the output power and the above-stated current value versus the laser diode current are illustrated in FIGS. 3 and 4. Symbols $I_1$ and $\Delta I$ in each figure indicate the current at the zero bias and the suppressed current as described before, respectively. In the former case, a long time is required for the rise of the laser, and a high-speed modulation is impossible. In the latter case, even when the laser output is reduced by controlling the applied D.C. voltage $V_D$, $\Delta I$ decreases together, so that the modulation factor decreases.

In actuality, therefore, the yield or available percentage of desirable composite devices lowers in the manufacture of the devices.

This invention contemplates to provide a composite semiconductor light emitting device which solves the problem of the yield and further facilitates handling as a light source for high-speed modulation.

Hereunder, the principle of this invention will be briefly described.

Figure 5:
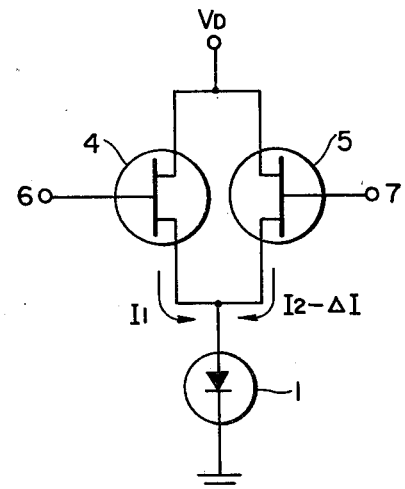
FIG. 5 is a diagram showing an equivalent circuit of a semiconductor light emitting device of this invention.
Figure 6:
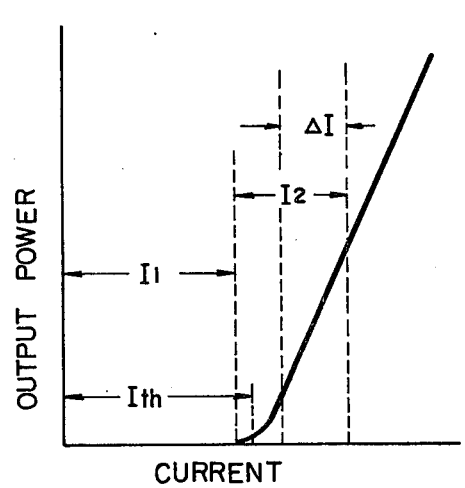
FIG. 6 is a graph elucidating the relationship between the current-output power characteristic of a laser element and the current value of an FET in the semiconductor light emitting device of this invention.

FIG. 5 shows an equivalent circuit of a semiconductor light emitting device of this invention. At least two FETs (4, 5) whose gate input terminals (6, 7) are independent of each other, and a semiconductor laser element 1 are integrated in combination. The FETs may well be quite identical to each other, or may well differ in performance. A D.C. bias is applied to one FET (4), to regulate a source-drain current $I_1$ to be approximately equal to a laser oscillation threshold value $I_{th}$. Subsequently, a modulating signal is applied to the gate of the other FET (5). Then, a current $I_2$ having flowed during the zero bias decreases $\Delta I$, and a laser beam can be modulated. FIG. 6 illustrates the relationship among the source-drain currents $I_1$ and $I_2$ and the decrement $\Delta I$. It is very easy to set the range of $\Delta I$ in the rectilinear part of a current-output power characteristic curve. With this system, it is possible to modulate a laser element of an arbitrary threshold value at a desired laser intensity. The semiconductor light emitting device of this invention shall be shortly termed "TC laser" by taking the first letters of the words of "Threshold Control".

Figure 7:
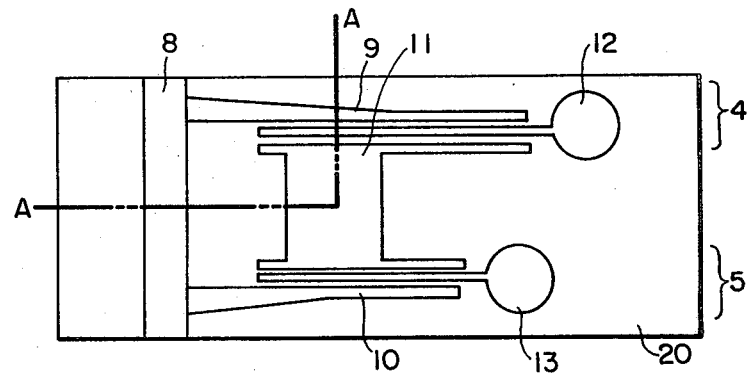
FIGS. 7 and 8 are a plan view and a sectional view of a semiconductor light emitting device of this invention, respectively.
Figure 8:
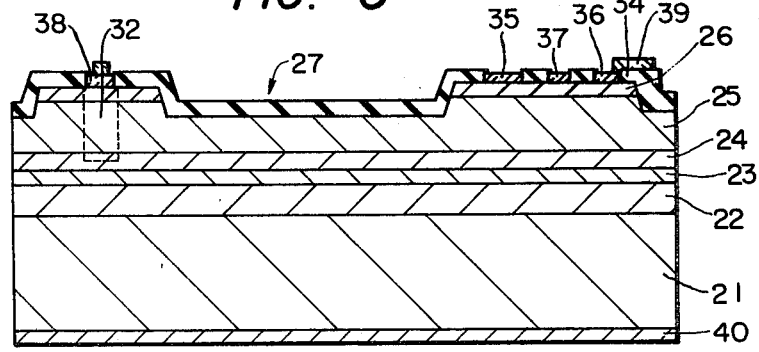

FIGS. 7 and 8 show a plan view and a sectional view of a typical semiconductor light emitting device of this invention, respectively. The sectional view is taken along A—A in the plan view of FIG. 7.

On a semiconductor substrate for growth 21, there are stacked first, second and third semiconductor layers 22, 23 and 24 which constitute a semiconductor laser element. In juxtaposition to the resultant structure, the stacked region of a fifth semiconductor layer 26 which forms the channel of an FET portion is formed on top of, at least, a fourth semiconductor layer 25 having a high resistivity.

The first semiconductor layer 22 serves as a first clad layer of the semiconductor laser element, the second semiconductor layer 23 as an active layer thereof, and the third semiconductor layer 24 as a second clad layer thereof. Naturally, the first and third semiconductor layers have a relatively low refractive index as compared with the second semiconductor layer, and they have conductivity types opposite to each other. Further, the first and third semiconductor layers are relatively great in the forbidden band gap.

The fourth semiconductor layer needs to have a resistivity of at least 10 $\Omega$·cm, and a range of resistivities up to 100 $\Omega$·cm-1 k$\Omega$·cm or so is employed in practical use. This layer is necessary for isolating the semiconductor laser element portion and the FET portion.

A recess or groove 27 is for isolation. It is not always necessary, depending upon the design of the semiconductor laser element and the FETs, but more favorably they are insulated. The insulating expedient of putting an inorganic insulator such as $SiO_2$, or a resin or the like into the recess may be employed as well. A high-resistivity region can also be formed by, for example, implanting protons into a predetermined part without digging the recess. The isolation may well be resorted to such insulating expedient. As to such isolation, techniques used in the fields of conventional semiconductor lasers and semiconductor devices may be employed.

In case where this semiconductor light emitting device is to be constructed of a GaAs-GaAlAs-based material, the respective semiconductor layers are, in general, selected as follows:

First semiconductor layer:

$Ga_{1-x}Al_xAs$ $(0.2 \leq x \leq 0.7)$ thickness—approximately 1 $\mu$m–3 $\mu$m
Second semiconductor layer:

$Ga_{1-y}Al_yAs$ $(0 \leq y \leq 0.3)$ thickness—approximately 0.05 $\mu$m–0.3 $\mu$m
Third semiconductor layer:

$Ga_{1-z}Al_zAs$ $(0.2 \leq z \leq 0.7)$ thickness—approximately 1 $\mu$m–3 $\mu$m
Fourth semiconductor layer:

$Ga_{1-s}Al_sAs$ $(0 \leq s \leq 0.7)$ thickness—approximately 0.5 $\mu$m–5 $\mu$m; resistivity—at least 10 $\Omega$·cm
Fifth semiconductor layer:

$Ga_{1-t}Al_tAs$ $(0 \leq t \leq 0.3)$ thickness—approximately 0.1 $\mu$m–0.3 $\mu$m Numerals 38 and 40 designate a p-side electrode and an n-side electrode of the semiconductor laser element, respectively. Numerals 35, 37 and 36 indicate a source electrode, a gate electrode and a drain electrode of the FET, respectively. In this case, the electrodes 38, 35, 36 and 40 are ohmic electrodes, and the electrode 37 is a Schottky electrode. Numeral 32 indicates a region in which Zn is selectively diffused in order to form an electrode lead-out portion of the semiconductor laser element, and numeral 34 an insulating film.

The second FET is fabricated by a similar structure.

Sections orthogonal to the traveling direction of a laser beam are formed with reflective faces by, for example, cleavage. Thus, an optical resonator is constructed.

The semiconductor light emitting device of the construction as above described can be caused to perform laser oscillation by short-circuiting the electrodes 38 and 36 and applying a voltage across the electrodes 35 and 40. (Numeral 39 designates a lead for short-circuiting the electrodes 38 and 36. Due to the way of taking the section, however, it is illustrated in a split manner in the drawing.)

Accordingly, the oscillation of the semiconductor laser can be controlled by applying a control voltage to a gate electrode 10.

As regards the semiconductor layers in FIG. 8, the first to fifth semiconductor layers are successively stacked, and the semiconductor laser element and the FET portion are respectively constructed in the desired regions. With this structure, the manufacturing method is easy. The semiconductor light emitting device of this invention, however, is not restricted to such fashion of stacking the semiconductor layers. By way of example, it is of course allowed that the stacked structure of the first, second and third semiconductor layers constituting the semiconductor laser element and the stacked structure of the fourth and fifth semiconductor layers constituting the FET portion are separately grown on the semiconductor substrate for growth. Such different practical constructions of this invention will be concretely described in conjunction with examples.

Needless to say, the construction of the semiconductor laser for optical confinement, the method of emitting light, etc. are not restricted to those of the foregoing embodiment.

Of course, this invention is not restricted to semiconductor materials to be referred to in the examples. While there are various expedients for the mode stabilization of semiconductor lasers, they may of course be applied to the semiconductor laser portion of the light emitting semiconductor device of this invention, and they fall within the scope of this invention.

EXAMPLE 1

FIGS. 9 to 14 are sectional views of a device showing various steps of a process for manufacturing the semiconductor light emitting device of this invention. A stripe-shaped recess 50 was formed in the surface of an n-type GaAs substrate (electron density $n \approx 10^{18}/cm^3$) 21 having the (100) plane as its upper surface. Subsequently, respective layers to be described below were formed by the well-known liquid epitaxial growth employing a slide boat. The aforecited recess may be formed by the selective etching or the like so as to extend in the direction perpendicular to the reflective faces of a resonator. The semiconductor layers having flat surfaces can be readily formed on the semiconductor substrate having an unevenness on the order of several $\mu m$ by the liquid epitaxial growth.

The recess serves to control a transverse mode by exploiting the leakage or penetration of laser radiation into the substrate. Techniques for the optical confinement have been reported in detail in "IEEE J. Quantum Electron", QE-14, 89 (1978) by K. Aiki et al., etc.

As a first semiconductor layer 22, an n-type $Ga_{0.7}Al_{0.3}As$ layer ($n \approx 5 \times 10^{17}/cm^3$) was made 2 $\mu m$ thick; as a second semiconductor layer 23, an n-type GaAs layer ($n \approx 10^{16}/cm^3$) was made 0.1 $\mu m$ thick; as a third semiconductor layer 24, a p-type $Ga_{0.7}Al_{0.3}As$ layer (hole density $p \approx 5 \times 10^{17}/cm^3$) was made 1 $\mu m$ thick; as a fourth semiconductor layer 25, a p-type $Ga_{0.7}Al_{0.3}As$ layer ($p \approx 1 \times 10^{14}/cm^3$, resistivity $\sim 600$ $\Omega \cdot cm$) was made 1 $\mu m$ thick; and as a fifth semiconductor layer 26, an n-type GaAs layer ($n \approx 2 \times 10^{17}/cm^3$) was made 0.3 $\mu m$ thick.

Figure 9:
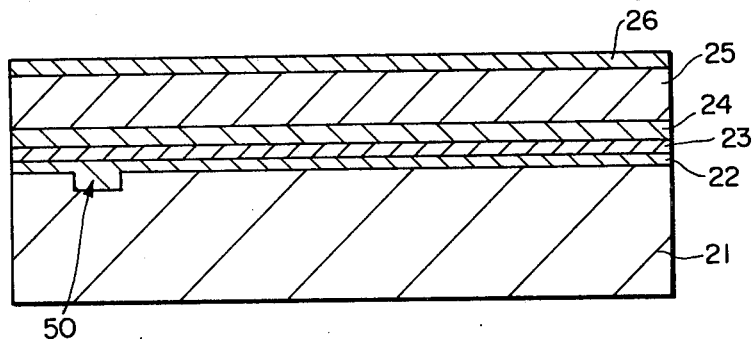
FIGS. 9 to 14 are sectional views of a device showing a process for manufacturing the semiconductor light emitting device of this invention.

FIG. 9 shows this state.

Figure 10:
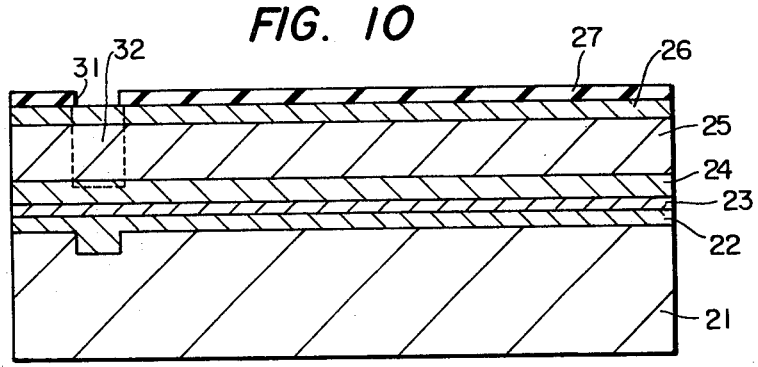

Subsequently, a two-layered insulating film consisting of $Al_2O_3$ at a thickness of 0.2 $\mu m$ and $SiO_2$ at a thickness of 0.3 $\mu m$ was formed by the well-known CVD (Chemical Vapor Deposition) process. That part of the two-layered insulating film which corresponded to an electrode lead-out portion of a semiconductor laser element was opened to a width of 6 $\mu m$. Liquid etchants were a mixed solution consisting of hydrogen fluoride and ammonium fluoride (at 1:6, for $SiO_2$) and phosphoric acid (for $Al_2O_3$). The $SiO_2$-$Al_2O_3$ two-layered film became a mask for selective diffusion 27. Through the opening, Zn was diffused at a width of 6 $\mu m$ and a depth down to the third semiconductor layer 24 by the well-known selective diffusion process. Shown at 32 is a Zn-diffused region. This state is illustrated in FIG. 10.

Figure 11:
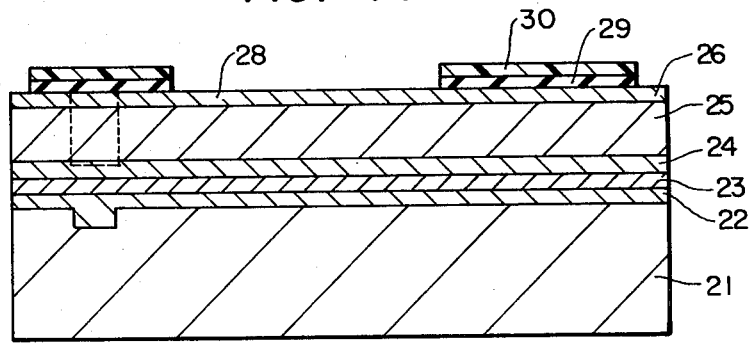
Figure 12:
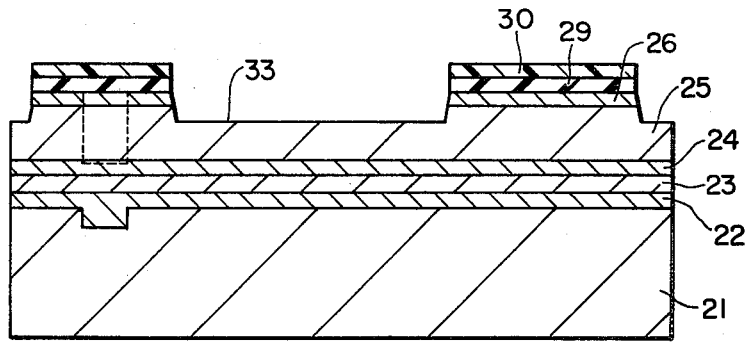

After the two-layered insulating film being the selective diffusion mask 27 was removed, an $SiO_2$ film 29 having a thickness of 5,000 Å was formed anew by the CVD process. A photoresist film 30 was formed on the $SiO_2$ film 29, and an opening 28 etc. were provided in the $SiO_2$ film 29 by the use of the conventional photolithography. This state is shown in FIG. 11. Using the resultant $SiO_2$ film 29 as an etching mask, the fifth semiconductor layer 26 and the fourth semiconductor layer 25 were mesa-etched. A liquid etchant was a mixed solution consisting of phosphoric acid, hydrogen peroxide and ethylene glycol (at 1:1:8). The resulting groove or recess 33 may well be so deep as to reach the first semiconductor layer 22, and it needs, at least, to penetrate through the fifth semiconductor layer 26. In case where an evaporated film of metal is employed in order to short-circuit the p-side electrode of the semiconductor laser element and the drain side electrode of an FET portion, the groove should favorably be shallower. FIG. 12 shows the state after the completion of the mesa etching.

The $SiO_2$ mask 29 for the mesa etching was removed, and an $SiO_2$ film 34 being 5,000 Å thick was formed anew by the CVD process. A positive type photoresist layer was formed on the $SiO_2$ film 34, and lead-out electrode portions for the source and drain of the FET portion were opened in the positive type photoresist layer. An Au-Ge alloy, Ni and Au were evaporated as three layers and to 2,500 Å as the lead-out electrodes of the source and drain. The substrate temperature during the evaporation may satisfactorily be held at the room temperature. Subsequently, the positive type photoresist film was removed. Accordingly, the three-layered electrode material was left in only the parts of the source and drain, and the material in the other parts was removed. The sample was heated to 450° C. to form the ohmic electrodes 35 and 36.

Figure 13:
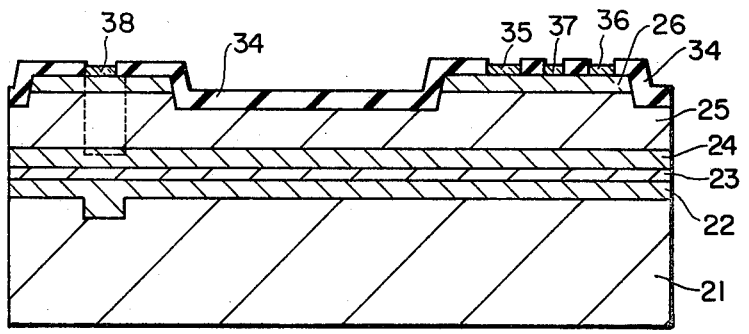
Figure 14:
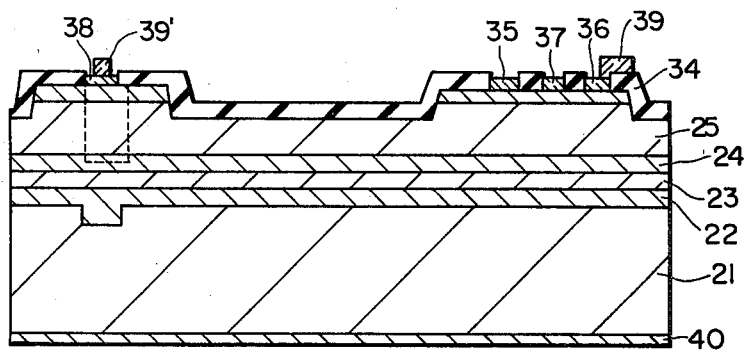

A positive type photoresist film was formed again, and it was provided with openings in correspondence with the electrode portion for the laser element and the gate electrode portion of the FET portion. As an electrode material, Cr and Au were successively evaporated to a thickness of 3,000 Å. The substrate temperature was held at 90° C. Subsequently, the positive type photoresist film was removed. Accordingly, the electrode material was left in only the electrode parts, and the material in the other parts was removed. FIG. 13 shows the state in which the electrodes were disposed.

Further, a positive type photoresist film was formed to a thickness of 1.2 $\mu m$ and was provided with openings for forming terminal portions for the external lead-out of the electrodes 36 and 37 and a short-circuit portion between the electrodes 35 and 38. Through the resultant mask, the exposed $SiO_2$ film was etched down to a thickness of 1,500 Å. Cr and Au were respectively evaporated 600 Å and 3,000 Å as leads 39 and 39' and the external lead-out terminal portions. (The leads 39 and 39' are connected though the connection is not clearly shown on account of the way of taking the section.)

After the rear surface of the semiconductor substrate 21 was polished and lightly etched, an Au-Ge alloy was evaporated to form an n-side electrode 40.

Lastly, the crystal was cleaved along planes perpendicular to the traveling direction of laser radiation, to construct an optical resonator. The cavity length was made 300 $\mu m$.

This light emitting device could be caused to perform laser oscillation by applying a voltage of 4-5 V across the drain electrode 36 and the n-side electrode 40 of the laser element. The oscillation wavelength was 8,300 Å, and the threshold current was approximately 60 mA.

The two FETs in the semiconductor light emitting device had specifications as stated below. One FET (5) had a source-drain distance of 6 μm, and a gate length of 2 μm. At this time, the mutual conductance $g_m$ of the FET was great and 15 m℧, and a current of 40 mA flowed during the zero bias of the gate. On the other hand, the FET (4) had a source-drain distance of 9 μm and a gate length of 3 μm. The mutual conductance $g_m$ of this FET was 10 m℧, and a current of 70 mA was obtained during the zero bias of the gate.

By operating the device as stated in the part of the explanation of the principle of this invention, the semiconductor laser element could be modulated very favorably. More specifically, the semiconductor laser element of $I_{th}=60$ mA could be modulated at 1.8 GHz in such a way that a current of 62 mA was caused to flow through the FET (4) and that the gate 7 of the FET (5) was supplied with, for example, the output signal of a TTL (transistor-transistor logic) circuit as had its pulses inverted.

Needless to say, this invention is not restricted to the GaAs-GaAlAs-based material but is realizable with other semiconductor materials.

By way of example, the semiconductor light emitting device of this invention can be realized with the following construction.

Since the fundamental steps are the same as in the foregoing example, the principal construction will be briefly described.

Used as a semiconductor substrate for growth is an InP substrate (doped with Sn, $3 \times 10^{18}/cm^3$) whose upper surface is the (100) plane. On this semiconductor substrate and by the liquid epitaxial growth, there are formed an n-type InP layer (doped with Te, $n \approx 3 \times 10^{18}/cm^3$) being 3 μm thick as the first semiconductor layer, a p-type $In_{0.73}Ga_{0.27}As_{0.59}P_{0.41}$ layer (doped with Zn, $p \approx 1 \times 10^{18}/cm^3$) being 0.2 μm as the second semiconductor layer, a p-type InP layer (doped with Zn, $p \approx 2 \times 10^{18}/cm^3$) being 2 μm thick as the third semiconductor layer, an InP layer ($p \approx 10^{14}/cm^3$) being 2 μm thick as the fourth semiconductor layer, and an n-type InP layer (doped with Sn, $n \approx 1 \times 10^{17}/cm^3$) being 0.2 μm thick as the fifth semiconductor layer.

It is the same as in the foregoing example that Zn is diffused in the electrode lead-out portion of the semiconductor laser portion.

An Au-Zn electrode is used as the p-side electrode of the laser portion, an Au-Ge electrode as the n-side electrode thereof, a Schottky electrode of Cr-Au as the gate electrode, and Au-Ge electrodes as the source and drain electrodes.

As a result, a semiconductor light emitting device having an oscillation wavelength of 1.3 μm and a threshold current of 100 mA could be realized and could be modulated at 2 GHz.

EXAMPLE 2

Figure 15:
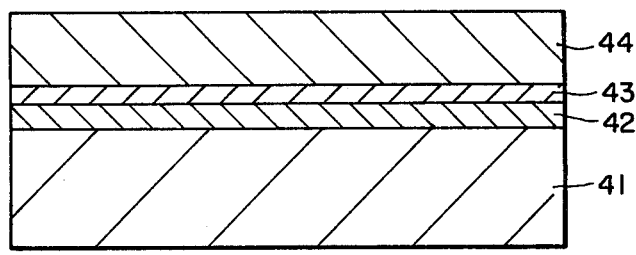
FIGS. 15 to 17 are sectional views of a device showing a process for manufacturing another embodiment of this invention.
Figure 16:
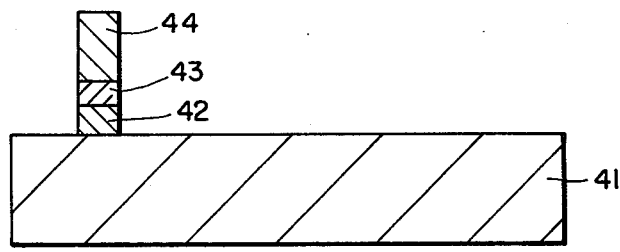
Figure 17:
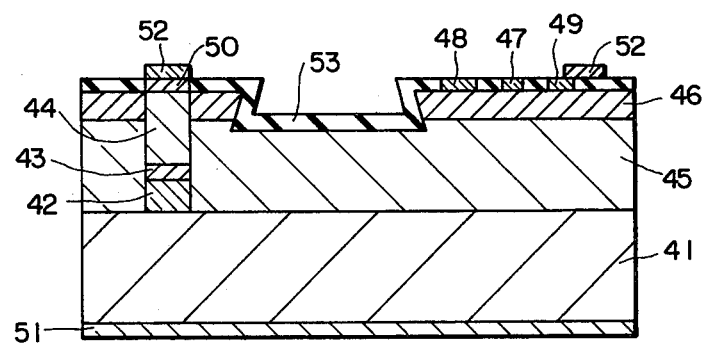

FIGS. 15 to 17 are views of manufacturing steps showing another embodiment of this invention. A plan view of this example is similar to FIG. 7.

On the surface of an n-type GaAs substrate (electron density $n \approx 10^{18}/cm^3$) 41 having the (100) plane as its upper surface, there were grown the respective layers of an n-$Ga_{0.65}Al_{0.35}As$ layer ($n \sim 10^{18}/cm^3$, 1.6 μm thick) 42, an n-$Ga_{0.95}Al_{0.05}As$ layer ($n \sim 10^{17}/cm^3$, 0.1 μm thick) 43 and a p-$Ga_{0.65}Al_{0.35}As$ layer ($p \sim 5 \times 10^{18}/cm^3$, 2 μm thick) 44. FIG. 15 shows this state.

An $SiO_2$ film having a thickness of 5,000 Å was formed on the surface of the third semiconductor layer 44 by the CVD process. The $SiO_2$ film was etched to form a stripe having a width of 5 μm by the well-known photolithography. Using the $SiO_2$ film as a mask, the semiconductor layers 42, 43 and 44 were etched with a liquid etchant which was a mixed solution consisting of phosphoric acid, hydrogen peroxide and water.

By resorting to the liquid epitaxial growth again, there were grown a p-$Ga_{0.6}Al_{0.4}As$ layer (hole density $p \sim 10^{14}/cm^3$) being 2.5 μm as a fourth semiconductor layer 45, and an n-GaAs layer ($n \sim 1 \times 10^{17}/cm^3$) being 0.3 μm thick as a fifth semiconductor layer 46.

As in Example 1, there were formed an $SiO_2$ film 53 as a passivation film, electrodes 47, 48, 49 and 50, a short-circuiting portion 52 between the electrodes 48 and 50, etc. Also materials may be those described before.

Further, an n-side electrode 51 was formed on the rear surface of the semiconductor substrate 41. Lastly, the crystal was cleaved along planes perpendicular to the traveling direction of laser radiation, to construct an optical resonator. The cavity length was made 300 μm.

Thus, the semiconductor light emitting device was completed. FIG. 17 is a sectional view of the device at this time.

The threshold current value of the fabricated laser was 10-30 mA, and the output power could be varied in a range of 3 mW-0 mW by varying the gate voltage over a range of 0--0.6 V.

EXAMPLE 3

It is also allowed that a semi-insulating semiconductor substrate is used to form an FET portion therein, whereas a semiconductor laser element portion is formed on a semiconductor substrate.

Figure 18:
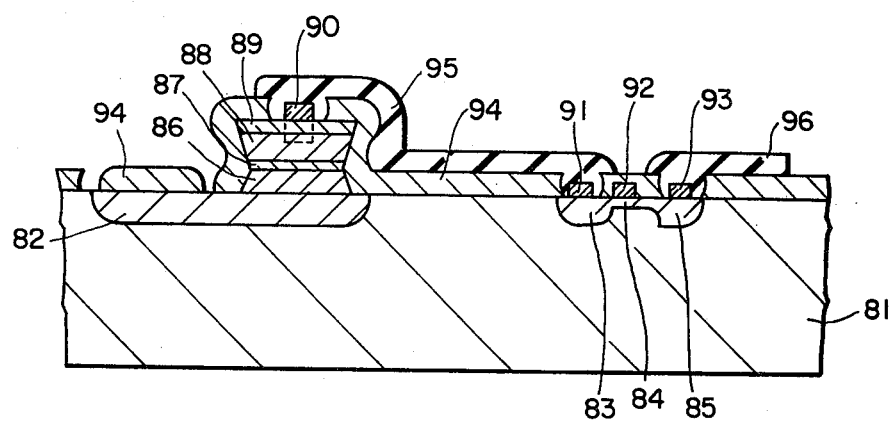
FIGS. 18, 20 and 21 are sectional views of devices each showing another embodiment of this invention.

FIG. 18 is a sectional view of a device illustrative of such an example. In this sectional view, the laser element portion and one FET portion have been appropriately taken as a section likewise to, for example, FIG. 8.

Figure 19:
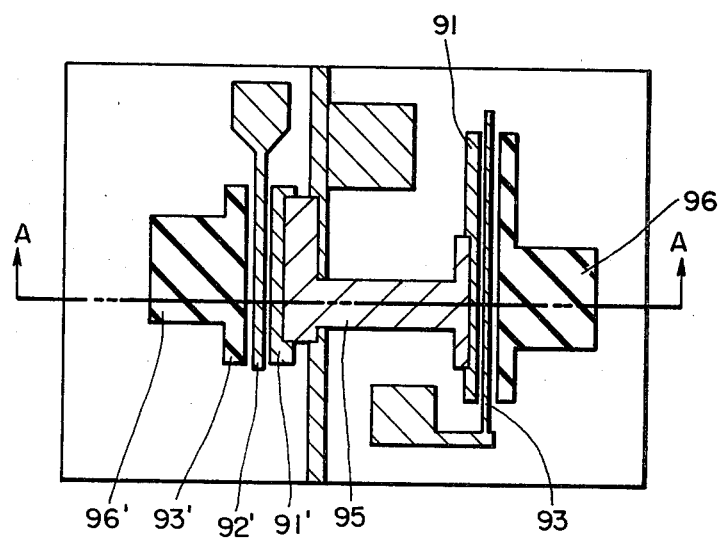
FIGS. 19 and 24 are plan views of devices.

A semi-insulating GaAs substrate 81 was implanted with Si (Sn, Se or the like may well be employed) by the ion implantation, to form a shallow n-type impurity region 84. Subsequently, S was ion-implanted in correspondence with an electrode leading-out part 82 of the laser element and parts 83 and 85 of the FET portion, to form deep and heavily-doped n-type impurity regions (hereinbelow, termed "n+ impurity regions") 82, 83 and 85. These steps may conform with a method used in the field of conventional semiconductor devices. Subsequently, there were formed semiconductor layers constituting the semiconductor laser portion, i.e., an n-type $Ga_{0.7}Al_{0.3}As$ layer 86 (first semiconductor layer), an n-type GaAs layer 87 (second semiconductor layer), a p-type $Ga_{0.7}Al_{0.3}As$ layer 88 (third semiconductor layer) and an n-type GaAs layer 89 (fourth semiconductor layer). The stacked semiconductor layers were mesa-etched, to leave an area to construct the laser portion. In the stacked semiconductor layers, a Zn-diffused region reaching the semiconductor layer 88 was formed. A Schottky electrode 92 for the FET was formed, and further, an $SiO_2$ film was formed as an insulating film 96 by the CVD process. Openings were provided in predetermined parts of the insulating film 96, and ohmic electrodes 91 and 93 for the FET were formed. Further, a p-side electrode 90 for the laser element was formed. A lead 95 for short-circuiting the p-side electrode 90 for the laser element and the source electrode 91 of the FET, an n-side lead-out electrode 94 for the laser element, and a drain lead-out electrode 97 and a gate lead-out electrode (not shown) of the FET were formed. FIG. 19 is a plan view of this example. In FIG. 19, the same numerals as in FIG. 18 indicate the same parts. Dashed numerals 91', 92', 93' and 96' correspond to the parts 91, 92, 93 and 96 of the other FET, respectively.

Figure 20:
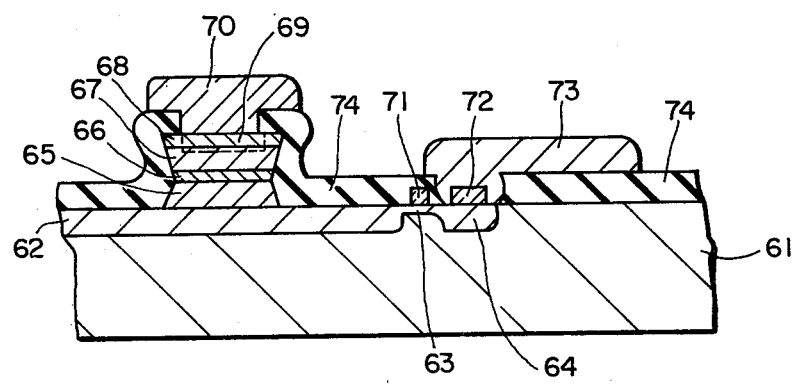
Figure 22:
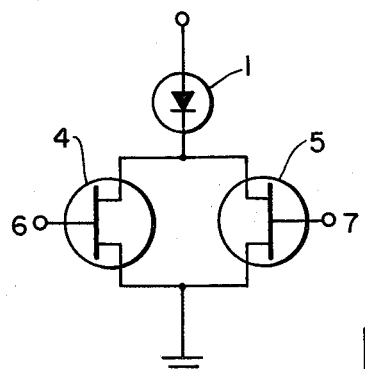
FIGS. 22 and 23 are diagrams each showing an equivalent circuit of a device of another embodiment of this invention.

Also FIG. 20 shows an example in which the FET portion was formed on a semiconductor substrate. In this example, the source electrode of the FET was grounded. FIG. 22 shows an equivalent circuit of this composite device. Numeral 1 designates a semiconductor laser, numerals 4 and 5 designate FETs respectively, and numerals 6 and 7 designate the gate electrodes of the respective FETs.

In a semi-insulating substrate 61, there were formed a shallow n-type impurity region 63 employing Si or the like and deep n+ impurity regions 62 and 64 employing S or the like. In this example, the n+ impurity region 62 served both as the drain of the FET and as the interconnection for short-circuiting the drain of the FET and the n-side electrode of the semiconductor laser. Likewise to the foregoing example, numerals 65, 66, 67 and 68 indicate an n-type $Ga_{0.7}Al_{0.3}As$ layer, an n-type GaAs layer, a p-type $Ga_{0.7}Al_{0.3}As$ layer and an n-type GaAs layer, respectively. Numeral 71 indicates a Schottky electrode for the FET gate electrode, and numeral 72 a source electrode. Numeral 74 indicates an insulating film, and numerals 70 and 73 indicate external lead-out electrodes respectively.

Figure 21:
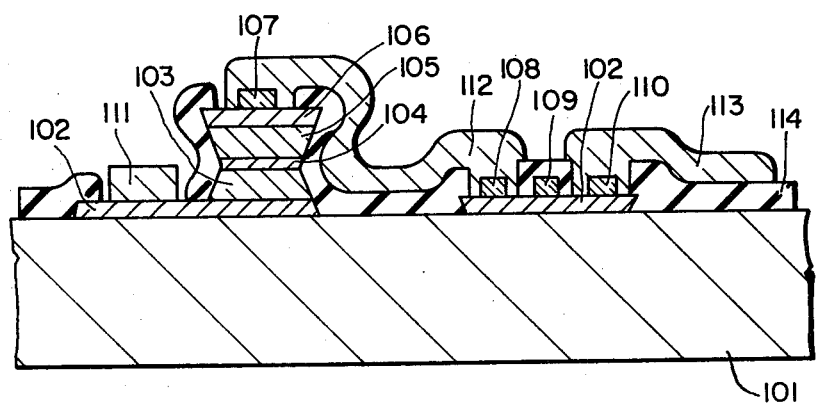

Also FIG. 21 shows an example which employed a semi-insulating substrate. In this example, a semiconductor laser element portion and an FET portion were disposed on the substrate.

On a semi-insulating substrate 101, an n-type GaAs layer 102 doped with Sn was formed and had a semiconductor laser element portion and an FET portion formed thereon. The other construction was the same as in the foregoing example. More specifically, numerals 103, 104, 105 and 106 designate first to fourth semiconductor layers constituting the semiconductor laser element respectively. Numerals 108, 109 and 110 designate the drain, gate and source electrodes of the FET respectively, numeral 114 designates an insulating layer, and numerals 111, 112, and 113 designate an n-side electrode of the semiconductor laser, an interconnection for short-circuiting a p-side electrode 107 of the semiconductor laser and the drain electrode of the FET, and a source lead-out electrode of the FET, respectively.

Figure 23:
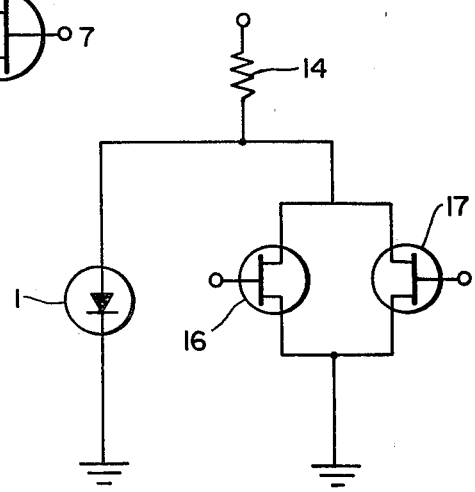
Figure 24:
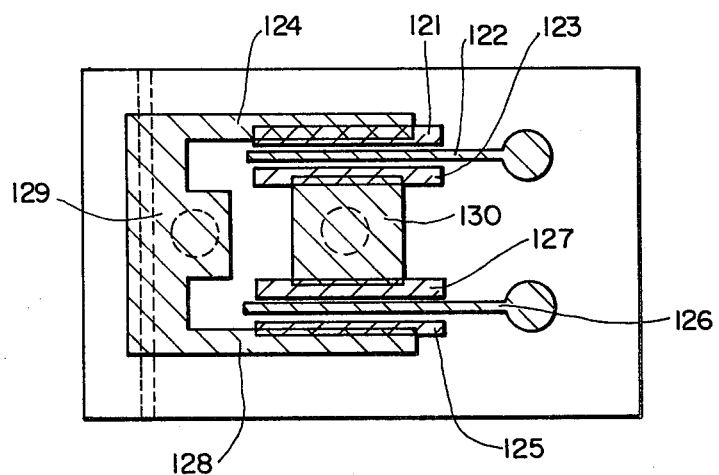

Also a semiconductor light emitting device of an equivalent circuit shown, in FIG. 23 can accomplish the same subject matter as in the examples thus far described. In correspondence with a semiconductor laser element (1), two FETs (16, 17) are integrated and disposed in parallel. A voltage is applied to the drain electrodes of the two FETs through a resistor 14. A D.C. bias is applied to the FET (16), and is adjusted so that the current value may become slightly smaller than the oscillation threshold value of the semiconductor laser (1). By applying a minus pulse signal to the gate of the FET (17), the FET (17) becomes a high resistance, so that the current on the semiconductor laser side increases to induce laser oscillation. FIG. 24 is a plan view of this example. Numerals 121 and 125 designate drain electrodes, numerals 122 and 126 gate electrodes, numerals 123 and 127 source electrodes, and numerals 124 and 128 leads which connect with a p-side electrode 129 of the semiconductor laser element. The electrode 129 is connected to a power source through a resistor. Shown at 130 is a lead for short-circuiting and grounding the source electrodes of the FETs.

What is claimed is:

1. An integrated semiconductor laser device comprising:
   (a) a layered semiconducting region comprising stacked semiconductor layers forming an optical confinement region which is capable of laser operation;
   (b) means for injecting current into said optical confinement region;
   (c) first switching means for supplying said means for injecting with a bias current having a value near a threshold current value for laser operation; and
   (d) second switching means for supplying a current to said means for injecting, to be superimposed on said bias current supplied by said first switching means, including an external input for controlling the amount of current fed by said second switching means.

2. An integrated semiconductor laser device according to claim 1, wherein said first and second switching means comprise first and second field effect transistors having their sources and drains short circuited together, one of the short circuited sources or drains connected to said means for injecting current and the other short circuited terminals coupled to a voltage source, the gate of said first field effect transistor coupled to a source of voltage which will result in said bias current and the gate of said other field effect transistor providing said means for controlling the current to be superimposed on said bias current.

3. An integrated semiconductor laser device according to claim 2, and further including an external input terminal coupled between said field effect transistors and said layered semiconductor region.

4. An integrated semiconductor laser device according to any of claims 1 to 3, wherein: said layered semiconductor region capable of laser oscillation and said first and second switching means are disposed on a predetermined substrate; said layered semiconductor region capable of laser oscillation includes first, second and third semiconductor layers successively stacked on said semiconductor substrate, said first and third semiconductor layers having a relatively small refractive index and a relatively great forbidden band gap as compared with those of said second semiconductor layer, said first and third semiconductor layers forming optical confinement layers and having conductivity types opposite to each other; said current injection means comprising a first electrode disposed on said semiconductor assembly and a second electrode disposed on a rear surface of said semiconductor substrate; and said first and second switching means formed on a fifth semiconductor layer disposed on said semiconductor substrate through a fourth semiconductor layer having a high resistivity.

5. An integrated semiconductor laser device according to claim 4, wherein said first, second, third, fourth and fifth semiconductor layers are stacked on said semiconductor substrate, and a current path is provided which extends from said first electrode for current injection to said third semiconductor layer through said fifth and fourth semiconductor layers.

6. An integrated semiconductor laser device according to any of claims 1 to 3, wherein said first and second switching means are formed on a predetermined semiconductor substrate, and said layered semiconductor region capable of laser oscillation is carried on another part of said semiconductor substrate.

7. An integrated semiconductor laser device according to claim 6, wherein said layered semiconductor region capable of laser oscillation comprises a stripe having first, second and third semiconductor layers successively stacked on said semiconductor substrate, said first and third semiconductor layers having a relatively small refractive index and a relatively great forbidden band gap as compared to with those of said second semiconductor layer, said first and third semiconductor layers forming optical confinement layers and having conductivity types opposite each other; a fourth semiconductor layer formed on said substrate and located adjacent and in abutting relationship with said stripe containing said first, second and third semiconductor layers and a fifth semiconductor layer disposed over said fourth semiconductor layer and abutting said third semiconductor layer in the said stripe, said first and second switching members formed on said fifth semiconductor layer, said current injection means comprising a first electrode disposed on said stripe and second electrode disposed on a rear surface of said semiconductor substrate.

8. An integrated semiconductor laser device according to claim 6, wherein said layered semiconductor region capable of laser oscillation comprises an etched mesa having first, second, third and fourth semiconductor layers successively stacked on a semi-insulating substrate, said first and third semiconductor layers having a relatively small refractive index and a relatively great forbidden band gap as compared to with those of said second semiconductor layer, said first and third semiconductor layers forming optical confinement layers and having conductivity types opposite each other; a implated semiconductor layer formed on said substrate beneath said etched mesa, said switching means formed by doped areas in another part of said substrate, said current injection means comprising a first electrode coupled to a diffused region extending into said third semiconductor layer through said fourth layer and a second electrode comprising said implanted layer below said mesa and a lead out therefore.

9. An integrated semiconductor laser device according to claim 6, wherein said voltage source to which said short circuited terminals are coupled is ground and further including a resistor for coupling a further voltage source to the one of the short circuited sources or drains connected to said means for injecting current.

10. An integrated semiconductor laser device according to claim 9, wherein said layered semiconductor region capable of laser oscillation comprises a mesa having first, second, third and fourth semiconductor layers successively stacked on a semi-insulating substrate, said first and third semiconductor layers having a relatively small refractive index and a relatively great forbidden band gap as compared to with those of said second semiconductor layer, said first and third semiconductor layers forming optical confinement layers and having conductivity types opposite each other; a diffused impurity region underlying said mesa and extending therefrom to another region of said substrate, said first and second switching means formed by diffused areas in said other region, said current injection means comprising a first electrode disposed on said mesa and second electrode formed by said diffused region below said mesa.

11. An integrated semiconductor laser device according to claim 6, wherein said layered semiconductor region capable of laser oscillation comprises a mesa having first, second, third and fourth semiconductor layers successively stacked on a base semiconductor layer formed on a semi-insulating substrate, said first and third semiconductor layers having a relatively small refractive index and a relatively great forbidden band gap as compared to with those of said second semiconductor layer, said first and third semiconductor layers forming optical confinement layers and having conductivity types opposite each other; a further portion of said base semiconductor layer formed on said substrate and spaced from said mesa, said first and second switching members formed on said further portion of said base semiconductor layer, said current injection means comprising a first electrode disposed on said mesa and a second electrode disposed on said base semiconductor underlying said mesa.

* * * * *